United States Patent
Cheng et al.

(10) Patent No.: US 8,486,489 B2
(45) Date of Patent: Jul. 16, 2013

(54) METHODS FOR ALIGNING POLYMER FILMS AND RELATED STRUCTURES

(75) Inventors: Joy Cheng, San Jose, CA (US); Daniel P. Sanders, San Jose, CA (US); Ratnam Sooriyakumaran, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 358 days.

(21) Appl. No.: 12/058,006

(22) Filed: Mar. 28, 2008

(65) Prior Publication Data

US 2009/0214823 A1 Aug. 27, 2009

Related U.S. Application Data

(63) Continuation of application No. 12/036,091, filed on Feb. 22, 2008.

(51) Int. Cl.
*B05D 3/00* (2006.01)

(52) U.S. Cl.
USPC .......................................... 427/271; 427/384

(58) Field of Classification Search
USPC ................................................ 427/384, 271
See application file for complete search history.

(56) References Cited

U.S. PATENT DOCUMENTS

| | | | |
|---|---|---|---|
| 5,310,580 A | 5/1994 | O'Sullivan et al. | |
| 6,383,952 B1 | 5/2002 | Subramanian et al. | |
| 6,416,933 B1 | 7/2002 | Singh et al. | |
| 6,492,075 B1 | 12/2002 | Templeton et al. | |
| 6,566,280 B1 | 5/2003 | Meagley et al. | |
| 6,753,117 B2 | 6/2004 | Lu | |
| 7,189,499 B2 | 3/2007 | Sugeta et al. | |
| 7,235,345 B2 | 6/2007 | Sugeta et al. | |
| 7,651,735 B2 | 1/2010 | Cheng et al. | |
| 2003/0027080 A1 | 2/2003 | Lu | |
| 2003/0091752 A1 | 5/2003 | Nealey et al. | |
| 2006/0003601 A1 | 1/2006 | Sugeta et al. | |
| 2006/0063077 A1 | 3/2006 | Hata et al. | |
| 2006/0134556 A1* | 6/2006 | Nealey et al. | 430/311 |
| 2006/0281266 A1 | 12/2006 | Wells | |
| 2007/0224819 A1* | 9/2007 | Sandhu | 438/689 |
| 2008/0193658 A1 | 8/2008 | Millward | |
| 2008/0274413 A1 | 11/2008 | Millward | |

(Continued)

OTHER PUBLICATIONS

Black et al. "Polymer Self-Assembly in Semiconductor Microelectronics" IBM J. Res. & Dev. vol. 51 No. Sep. 5, 2007.*

(Continued)

*Primary Examiner* — Robert S Walters, Jr.
(74) *Attorney, Agent, or Firm* — Schmeiser, Olsen & Watts, LLP

(57) ABSTRACT

Methods and a structure. The method includes applying a solution including two or more immiscible polymers to a substructure including features having at least one sidewall and a bottom surface. The immiscible polymers include a first polymer and a second polymer. The at least one sidewall includes a material. A selective chemical affinity of the first polymer for the material is greater than a selective chemical affinity of the second polymer for the material. The first polymer is segregated from the second polymer. The first polymer selectively migrates to the at least one sidewall, resulting in the first polymer being disposed between the at least one sidewall and the second polymer. One or more immiscible polymers is selectively removed. At least one immiscible polymer remains, resulting in forming structures including the substructure and the immiscible polymer remaining. Two additional methods and a structure are also included.

19 Claims, 6 Drawing Sheets

U.S. PATENT DOCUMENTS

| | | | |
|---|---|---|---|
| 2008/0299353 A1* | 12/2008 | Stoykovich et al. | 428/195.1 |
| 2009/0107950 A1 | 4/2009 | Cheng et al. | |
| 2009/0179001 A1 | 7/2009 | Cheng et al. | |
| 2009/0182093 A1 | 7/2009 | Cheng et al. | |
| 2009/0212016 A1 | 8/2009 | Cheng et al. | |
| 2009/0233236 A1 | 9/2009 | Black et al. | |
| 2009/0305173 A1 | 12/2009 | Xiao et al. | |
| 2010/0009132 A1 | 1/2010 | Cheng et al. | |

OTHER PUBLICATIONS

Kailas et al. "Multitechnique Characterization of Thin Films of Immiscible Polymer Systems: PS-b-PMMA diblock copolymers and PS-PMMA symmetric blends" Surf. Interface Anal. Feb. 2005; 37: 435-443.*

Stoykovich et al. "Directed Assembly of Block-Copolymer Blends into Nonregular Device-Oriented Structures" Science vol. 308 Jun. 2005, pp. 1442-1446.*

Abe et al., "Contact Hole Shrink Process with Novel Chemical Shrink Materials," Proceedings of SPIE, 2005, vol. 5753, pp. 206-213.

Freer et al., "Oriented Mesoporous Organosilicate Thin Films," Nano Letters, 2005, vol. 5, No. 10, pp. 2014-2018.

Hah et al., "In-Line Chemical Shrink for 70 nm Contact Holes by Electrostatic Self-Assembly," SPIE 2005, pp. 1-18.

Kim et al., "Analytical Study on Small Contact Hole Process for Sub-65 nm Node Generation," J. Vac. Sci. Technology B 22, 2004, pp. L38-L43.

Park et al., "Controlled Ordering of Block Copolymer Thin Films by the Addition of Hydrophilic Nanoparticles," American Chemical Society, 2007, 40, pp. 8119-8124.

Terai et al., "Newly Developed RELACS Materials and Process for 65 nm Nodes," Proc. of SPIE, 2006, vol. 6153, pp. 61532I-1-8.

Wallace et al., "Optimization of Resist Shrink Techniques for Contact Hole and Metal Trench ArF Lithography at the 90nm Technology Node," Proc. of SPIE, 2004, vol. 5376, pp. 238-244.

Patent Application No. 12/913,835, Filing Date Oct. 28, 2010, First Named Inventor Joy Cheng.

Harris et al.; Surface Morphology of Annealed Polystyrene and Poly(methyl methacrylate) Thin Film Blends and Bilayers; Macromolecules 2003, 36. pp. 3307-3314.

Notice of Allowance (Mail Date Nov. 9, 2010) for U.S. Appl. No. 12/036,091, filed Feb. 22, 2008.

* cited by examiner

METHODS FOR ALIGNING POLYMER FILMS AND RELATED STRUCTURES

This application is a continuation application claiming priority from Ser. No. 12/036,091 filed Feb. 22, 2008.

FIELD OF THE INVENTION

The invention relates to methods for aligning polymers and other materials on substrates and structures formed therefrom.

BACKGROUND OF THE INVENTION

Smaller critical dimension (CD) and tighter pitch for both line/space patterns and contact holes allows denser circuitry to be created and therefore reduces overall production cost. For resist space shrink, two widely used processes to reduce the dimensions of patterned features are SAFIER® (shrink assist film for enhanced resolution) and RELACS® (resolution enhancement lithography assisted by chemical shrink). The SAFIER® process decreases the dimensions of the spaces between adjacent resist structures by covering the patterned resist with a layer of polymer which contracts during subsequent heating and stretches the resist structures. The RELACS® process uses acid catalyzed cross-linking polymers to form a crosslinked coating around the existing resist features. However, both these processes have detrimental dependencies on pattern geometry (density and pitch) or resist chemistry which 1) limits the shrink dimension and uniformity in the RELACS® process and 2) limits the process window in the SAFIER® process. For reducing the pitch, sidewall coating processes have also been utilized to reduce the pitch of a lithographic pattern. However these patterning processes require a large number of process steps, frequently require many deposition steps employing expensive tools, and in some cases the dimensions of the resulting structures are dependent upon the coating thickness. Therefore, there exists a need for a high throughput method for cost effectively reducing resist feature dimensions or pitches, which is less sensitive to the resist chemistry and process conditions.

SUMMARY OF THE INVENTION

The present invention relates to a method, comprising:
applying a solution comprising two or more immiscible polymers to a substructure disposed on a substrate, said substructure comprising at least one feature having at least one sidewall and a bottom surface, said two or more immiscible polymers comprising a first polymer and a second polymer, said at least one sidewall comprising a first material, a selective chemical affinity of said first polymer for said first material being greater than a selective chemical affinity of said second polymer for said first material;
after said applying, segregating said first polymer from said second polymer, said first polymer selectively segregating to said at least one sidewall of said at least one feature, resulting in said first polymer being disposed between said sidewall and said second polymer; and
after said segregating, removing selectively one or more immiscible polymers of said two or more immiscible polymers, at least one immiscible polymer of said two or more immiscible polymers remaining on said substrate after said removing, resulting in forming structures on said substrate, said structures comprising said substructure and said at least one immiscible polymer remaining.
The present invention relates to a structure, comprising:
a substrate having a topographically patterned surface, said topographically patterned surface comprising a plurality of features, each feature of said plurality of features having at least one sidewall and an adjoining bottom surface essentially perpendicular to said at least one sidewall, said at least one sidewall comprising a first material; and
a polymer blend disposed on said topographically patterned surface, said polymer blend comprising a first polymer and a second polymer, said first polymer immiscible with said second polymer, said first polymer forming a first layer conforming to said at least one sidewall due to said first polymer having a higher chemical affinity than said second polymer for said first material, wherein said first layer is disposed between said second layer and said at least one sidewall.
The present invention relates to a material alignment method, comprising:
forming a composition comprising two or more immiscible polymers, said immiscible polymers comprising a first immiscible polymer and a second immiscible polymer;
forming a film of said composition on a topographically patterned surface of a substrate, said surface having a plurality of features disposed thereon, each feature of said plurality of features having at least one sidewall essentially perpendicular to said surface said at least one sidewall comprising a first material, said first immiscible polymer having a selective chemical affinity for said first material greater than a selective chemical affinity of said second immiscible polymer for said first material; and
segregating selectively said first immiscible polymer to said at least one sidewall, said segregating resulting in excluding by said first immiscible polymer said second immiscible polymer from said at least one sidewall, resulting in said first immiscible polymer forming a first layer conforming to said at least one sidewall, said second immiscible polymer forming a second layer conforming to said first layer, said first layer disposed between said at least one sidewall and said second layer, resulting in said first layer and said second layer aligning essentially parallel to said at least one sidewall.
The present invention relates to a method of forming controlled polymer patterns, comprising:
forming a material layer from a solution of polymer blends comprising at least two polymers, A and B, onto a surface of a topographically patterned substrate comprising prepatterned features separated by a bottom surface, sidewalls of said features having a composition different from a composition of said bottom surface;
forming a segregating film on said topographically patterned substrate, wherein components in said material layer laterally segregate in accordance with the patterned substrate, and wherein polymer A preferentially segregates next to said sidewalls and polymer B preferentially segregates to a center region between said features; and
selectively removing one or more polymers from said segregated film while leaving at least one polymer remaining on said substrate.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings.

DETAILED DESCRIPTION OF THE INVENTION

Figure 1A:
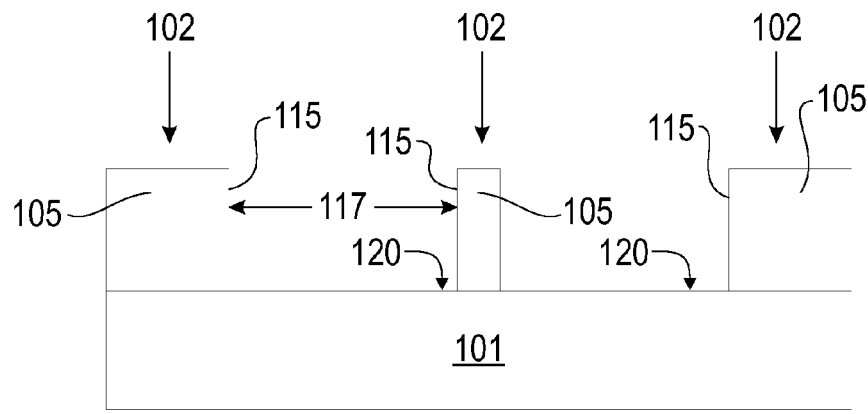
FIG. 1A is an illustration of a substrate with a substructure disposed on a surface of the substrate, in accordance with embodiments of the present invention.

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as examples of embodiments. The features and advantages of the present invention are illustrated in detail in the accompanying drawings, wherein like reference numerals refer to like elements throughout the drawings. Although the drawings are intended to illustrate the present invention, the drawings are not necessarily drawn to scale.

The following are definitions:

A monomer as used herein is a molecule that can undergo polymerization which contributes constitutional units to the essential structure of a macromolecule, an oligomer, a block, a chain, and the like.

A polymer as used herein is a macromolecule comprising multiple repeating smaller units or molecules (monomers) derived, actually or conceptually, from smaller units or molecules, bonded together covalently or otherwise. The polymer may be natural or synthetic.

A copolymer as used herein is a polymer derived from more than one species of monomer.

A block copolymer as used herein is a copolymer that comprises more than one species of monomer, wherein the monomers are present in blocks. Each block of the monomer comprises repeating sequences of the monomer. A formula (1) representative of a block copolymer is shown below:

(1)

wherein A, B, C, and D represent monomer units and the subscripts "a", "b", "c", and "d", represent the number of repeating units of A, B, C, and D respectively. The above referenced representative formula is not meant to limit the structure of the block copolymer used in an embodiment of the present invention. The aforementioned monomers of the copolymer may be used individually and in combinations thereof in accordance with the method of the present invention.

A di-block copolymer has blocks of two different polymers. A formula (2) representative of a di-block copolymer is shown below:

(2)

where subscripts "m" and "n" represent the number of repeating units of A and B, respectively. The notation for a di-block copolymer may be abbreviated as A-b-B, where A represents the polymer of the first block, B represents the polymer of the second block, and -b- denotes that it is a di-block copolymer of blocks of A and B. For example, PS-b-PMMA represents a di-block copolymer of polystyrene (PS) and polymethylmethacrylate (PMMA).

A substrate, as used herein, is a physical body (e.g., a layer or a laminate, a material, and the like) onto which materials (such as polymers, polymeric materials, metals, oxides, dielectrics, etc.) may be deposited or adhered.

A nanoparticle as used herein is a particle on the order of 1 nanometer (nm) to 100 nm in dimension. Examples of the structure may include but are not limited to nanorods, nanosheets, nanospheres, nanocylinders, nanocubes, nanoparticles, nanograins, nanofilaments, nanolamellae, and the like having solid composition and a minimal structural dimension in a range from about 1 nm to about 100 nm.

The substrates described herein may include semiconducting materials, insulating materials, conductive materials, or any combination thereof, including multilayered structures. Thus, for example, a substrate may comprise a semiconducting material such as Si, SiGe, SiGeC, SiC, GaAs, InAs, InP and other III/V or II/VI compound semiconductors. A substrate may comprise, for example, a silicon wafer or process wafer such as that produced in various steps of a semiconductor manufacturing process, such as an integrated semiconductor wafer. A substrate may comprise a layered substrate such as, for example, Si/SiGe, Si/SiC, silicon-on-insulators (SOIs) or silicon germanium-on-insulators (SGOIs). A substrate may comprise layers such as a dielectric layer, a barrier layer for copper such as SiC, a metal layer such as copper, a hafnium dioxide layer, a silicon layer, a silicon oxide layer, the like, or combinations thereof. A substrate may comprise an insulating material such as an organic insulator, an inorganic insulator or a combination thereof including multilayers. A substrate may comprise a conductive material, for example, polycrystalline silicon (polySi), an elemental metal, alloys of elemental metals, a metal silicide, a metal nitride, or combinations thereof, including multilayers. A substrate may comprise ion implanted areas, such as ion implanted source/drain areas having P-type or N-type diffusions active to the surface of the substrate.

In some embodiments, a substrate may include a combination of a semiconducting material and an insulating material, a combination of a semiconducting material and a conductive material or a combination of a semiconducting material, an insulating material and a conductive material. An example of a substrate that includes a combination of the above is an interconnect structure.

FIG. 1A is an illustration of a substrate 101 with a substructure 105 disposed on a surface of the substrate 101. The substructure 105 may comprise at least one feature 102, having at least one sidewall 115 and an adjoining bottom 120.

The at least one feature 102 may comprise a plurality of features, for example. The bottom 120 may be essentially perpendicular to the sidewall 115. The bottom 120 may be defined by an exposed portion of the surface of the substrate 101. The bottom 120 may comprise a material which is the same or different from material comprising the at least one sidewall 115. The structures herein, in addition to at least one sidewall and a bottom, may comprise, for example, holes, trenches, vias, posts, lines, or a combination of these. The at least one sidewall 115 may comprise two sidewalls 115 separated by a distance 117. The substructure 105 may comprise the summation of all the material in a layer comprising the topography and may be continuous or non-continuous as necessary to form patterns that include holes, posts, islands, lines, and trenches, etc., any of which may be isolated or nested.

The substructure 105 may be integral with the substrate 101, for example the substrate 101 surface may comprise a plurality holes etched into a substrate surface by a method such as by reactive ion etching (RIE) for example. The substructure 105 may be formed on the substrate surface by a process such as patterning a photoresist, patterning a polymer, patterning an inorganic material, etching, chemical vapor deposition, sputtering, atomic layer deposition, coating, chemical attachment, or a combinations of these. Chemical attachment may comprise the use of chemical shrink materials to deposit layers onto the substrate.

Figure 1B:
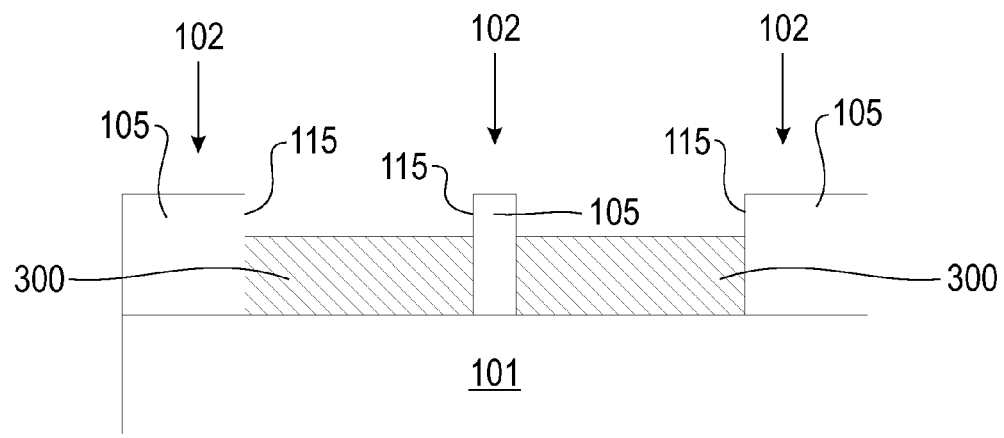
FIG. 1B is an illustration of the substrate and substructure of FIG. 1A after applying a solution to the substructure, in accordance with embodiments of the present invention.

FIG. 1B is an illustration of the substrate 101 and substructure 105 of FIG. 1A after applying a solution 300 to the substructure 105. The solution 300 may comprise two or more immiscible polymers, where the two or more immiscible polymers may comprise a first polymer and a second polymer. The first polymer may have a chemical affinity for the material of the sidewalls 115 which is higher than the chemical affinity of the second polymer for the sidewalls 115. Applying the solution may for a film having a thickness in a range from about 5 nanometers (nm) to about 500 nm.

Additional materials (such as a RELACS©-type material) may be used to modify the substructure, where additional layers may be deposited onto the sidewalls to adjust the chemical properties of the sidewall such that they will have an increased or decreased affinity for the two or more immiscible polymers. For example, a polar chemical shrink material may be used to increase the polarity of the sidewalls to favor interactions with the more polar component of the two or more immiscible polymers. Also, a more hydrophobic shrink material may be deposited on the sidewalls to favor interactions with a non-polar component of the two or more polymers. In addition, shrink materials having functional groups may be deposited on the sidewalls to promote affinity for polymer that will have specific interactions with them (i.e. ionic bonds, hydrogen bonding, etc.) in order to control which of the two or more polymers will sequester next to the at least one sidewall.

The term "immiscible" as used herein refers to the at least two polymers in the polymer blend being incompatible enough to drive phase segregation under certain process conditions. The immiscibility of the polymers in the polymer blends may depend on the composition as well as the film forming process of the polymer blends. The ratio of the polymers, molecular weight of the individual polymers in the blend, and the presence of other additional components in the blend may adjust the compatibility of the polymers in the polymer blend. Temperature, coating conditions, and substrate surface properties may also affect the segregation of the polymers in the substrate topography. As used herein, an "immiscible polymer" is defined as a polymer from a polymer blend composition which segregates in the topography on a properly prepared topographical substrate under proper process conditions.

Examples of suitable polymers for the two or more immiscible polymers include: cellulose, poly(acrylamide), polyethyleneimine, poly(acrylic acid), poly(2-ethyl-2-oxazoline), poly(ethyleneoxide), and poly(vinyl alcohol), novolac resins, cresol resins, poly(hydroxystyrene), poly(acrylic acid), poly (styrene sulfonic acid), poly(vinyl phosphoric acid), poly (vinyl sulfonic acid), poly(2-sulfoethyl methacrylate), poly (2-sulfopropyldimethyl-3-methacrylamide), poly(1,1,1-trifluoro-2-(trifluoromethyl)-2-hydroxy-pentan-4-yl methacrylate), fluoroalcohol-based polymers, poly(2-ethyl-trifluoromethanesulfonamide methacrylate), acidic sulfonamide polymers, poly(styrene), poly(hydroxyadamantyl methacrylate), poly(isobornyl methacrylate), poly(phenyl methacrylate), poly(vinyl naphthalene), polysiloxanes, polymethylsilsesquioxanes, polycarbosilanes, poly(vinyl ferrocene), poly(acylonitrile), poly(caprolactone), poly(lactide), poly(methyl methacrylate), poly(2-hydroxyethyl methacrylate), poly(gamma-butyrolactone methacrylate), poly(tetrahydrofuranyl methacrylate), poly(tetrahydropyranyl methacrylate), poly(allyl amine), poly(4-aminostyrene), poly(2-dimethylaminoethyl methacrylate), polyethyleneneimine, poly(N-methylvinylamine), poly(vinyl pyridine), poly (isoprene), poly(butadiene), poly(nobornene), poly(ethylene), poly(propylene), poly(1,1,1-trifluoro-2-(trifluoromethyl)-2-hydroxy-pentan-4-yl methacrylate), fluoroalcohol-based polymers, poly(2-ethyl-trifluoromethanesulfonamide methacrylate), acidic fluorosulfonamide polymers, poly(2,2,2-trifluoroethyl methacrylate), poly (hexafluoroisopropyl methacrylate), poly(2,3,4,5,6-pentafluorostyrene), and substituted derivatives thereof. The two or more immiscible polymers may be selected such that each polymer is immiscible with each other polymer in the blend.

The solution 300 comprising the first and second polymers may further comprise a third polymer. Examples of a third polymer include, homopolymers, block copolymers, grafted copolymers, and random copolymers For example, if a polymer blend is made from immiscible polymer A and immiscible polymer B, then a A-b-B, A-grafted-B, or A-ran-B can be used to adjust the interfacial energy between domains of polymer A and domains of polymer B, where A-grafted-B denotes a grafted copolymer of polymer A and polymer B, and A-ran-B denotes a random block copolymer of polymer A and polymer B. For example, adding A-b-B or A-grafted-B would reduce the interfacial energy between polymer A and polymer B, and, therefore, affect the segregation behavior of the polymer blends. In addition, the lateral dimension of layer A and layer B may depend on the ratio of polymer A and polymer B and the additional components in the blend.

The solution 300 may comprise one or more additional components, such as photosensitive acid generators, surfactants, base quenchers, nanoparticles, metal compounds, inorganic compounds, and solvents. The nanoparticles may comprise materials such as inorganic oxides (alumina, titania, halfnia, etc.), inorganic nitrides, inorganic carbide, or metals (gold, etc.). Examples of inorganic compounds include organometallic compounds, such as ferrocene, which may impart high oxygen etch resistance to the polymer domain in which the metal compound are dissolved. Examples of inorganic compounds include organosilicates or organosilicon/organogermanium compounds, which may readily form etch resistant glasses during oxygen reactive ion etching (RIE) processes.

Surfactants described herein may be used to improve coating uniformity, and may include ionic, non-ionic, monomeric, oligomeric, and polymeric species, or combinations thereof. Examples of possible surfactants include fluorine-containing surfactants such as the FLUORAD® series available from 3M Company in St. Paul, Minn., and siloxane-containing surfactants such as the SILWET® series available from Union Carbide Corporation in Danbury, Conn.

Solvents described herein may be used to dissolve the components in the solution 300, so that the solution 300 may be applied evenly on the substrate surface to provide a defect-free coating. Some examples of suitable solvents include ethers, glycol ethers, aromatic hydrocarbons, ketones, esters, ethyl lactate, gamma-butyrolactone (GBL), cyclohexanone, ethoxyethylpropionate (EEP), a combination of EEP and GBL, and propylene glycol methyl ether acetate (PGMEA). The embodiments described herein are not limited to the selection of any particular solvent. The solvent for the solution 300 may be chosen such that the solvent does not dissolve the substructure or underlying layers of the substrate.

Base quenchers described herein may comprise aliphatic amines, aromatic amines, carboxylates, hydroxides, or combinations thereof. For example, base quenchers may include: tetra alkyl ammonium hydroxides, cetyltrimethyl ammonium hydroxide, dimethylamino pyridine, 7-diethylamino-4-methyl coumarin (Coumarin 1), tertiary amines, sterically hindered diamine and guanidine bases such as 1,8-bis(dimethylamino)naphthalene (PROTON SPONGE®), berberine, or polymeric amines such as in the PLURONIC® or TETRONIC® series commercially available from BASF. The embodiments described herein are not limited to any specific selection of these expedients. Corporation in Danbury, Conn.

The photosensitive acid generators (PAG) described herein are capable of producing or generating an amount of acid (such as 1 mole of acid per mole of PAG, for example) upon exposure to a dose of electromagnetic radiation, such as visible, ultraviolet (UV) and extreme ultraviolet (EUV), for example. The PAG may comprise, for example, triphenyl sulfonium nonaflate (TPSN), (trifluoro-methylsulfonyloxy)-bicyclo[2.2.1]hept-5-ene-2,3-dicarboximide (MDT), N-hydroxy-naphthalimide dodecane sulfonate (DDSN), onium salts, aromatic diazonium salts, sulfonium salts, diaryliodonium salts, sulfonic acid esters of N-hydroxyamides, imides, or combinations thereof.

The solution 300 may be applied by spin coating the solution 300 onto the substrate 101 at a spin speed in a range from about 1 rpm to about 10,000 rpm. The solution 300 may be spin coated at room temperature without a post-drying process. The applied solution 300 may be thermally annealed, such as at a temperature above the glass transition temperature of the first polymer and above the glass transition temperature of the second polymer. The applied solution 300 may be vapor annealed, after applying the solution 300 to the substrate 101, such as by annealing the applied solution 300 under organic solvent vapor at or above room temperature (about 25° C.) from about 10 hours to about 15 hours, for example.

The spin coating process used is not meant to limit the type of processes that may be used when applying the solution to the substructure 105. Other processes such as dip-coating and spray-coating, a combination thereof, or any other process which provides a means for applying the solution 300 to the substructure 105 may be employed.

Figure 1C:
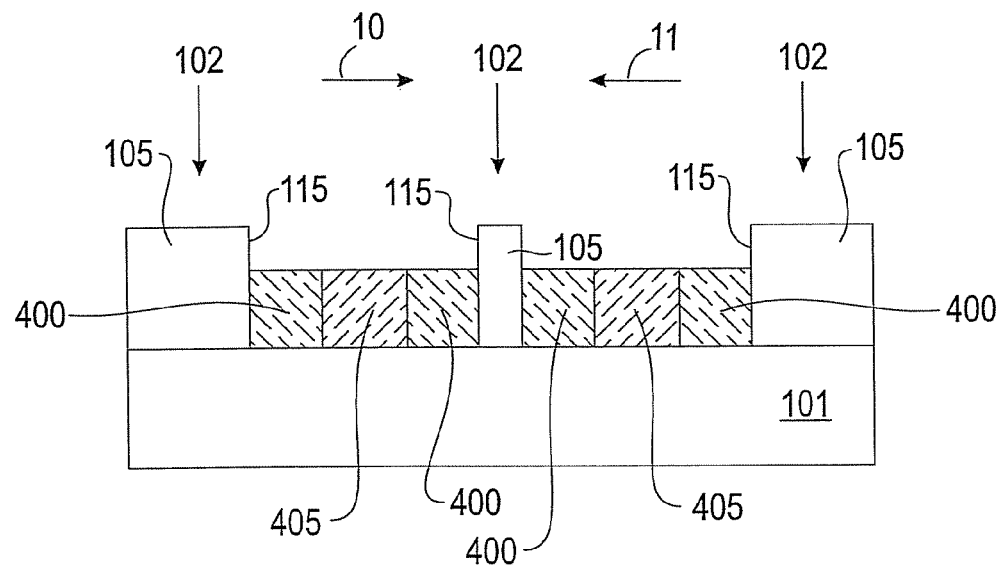
FIG. 1C is an illustration of the solution in FIG. 1B after segregating the first polymer from the second polymer, in accordance with embodiments of the present invention.

FIG. 1C is an illustration of the solution in FIG. 1B after segregating, the first polymer 400 from the second polymer 405. The first polymer 400 selectively migrates to the at least one sidewall 115 of the at least one feature 102, resulting in the first polymer 400 being disposed between the sidewall 115 and the second polymer 405. The second polymer 405 may be disposed in a central position between sidewalls of two adjacent portions of the substructure 105, and separated from each sidewall 115 by a layer of the first polymer 400. The first polymer 400 may migrate towards the at least one sidewall 115 due to having a higher affinity for the at least one sidewall 115 than does the second polymer 405. The second polymer 405 may be excluded from the at least one sidewall 115 by the first polymer 400 due to the lower affinity of the second polymer 405 for the at least one sidewall 115. For example, the at least one sidewall may comprise a hydrophilic material and the first polymer may comprise a hydrophilic polymer, where the second polymer may comprise a hydrophobic polymer. In such a case, the first polymer would have a much stronger selective chemical affinity for the at least one sidewall than would the second polymer. In the example illustrated in FIG. 1C, neither the first polymer 400 nor the second polymer 405 have a higher selective chemical affinity for the material comprising the bottom 120 of the feature 102. Thus in FIG. 1C, the first polymer 400 and the second polymer 405 are distributed in a polymer segregation pattern in which the first polymer 400 and the second polymer 405 are distributed in a direction 10 or 11 that is perpendicular to each sidewall of the at least one sidewall 115.

Figure 1D:
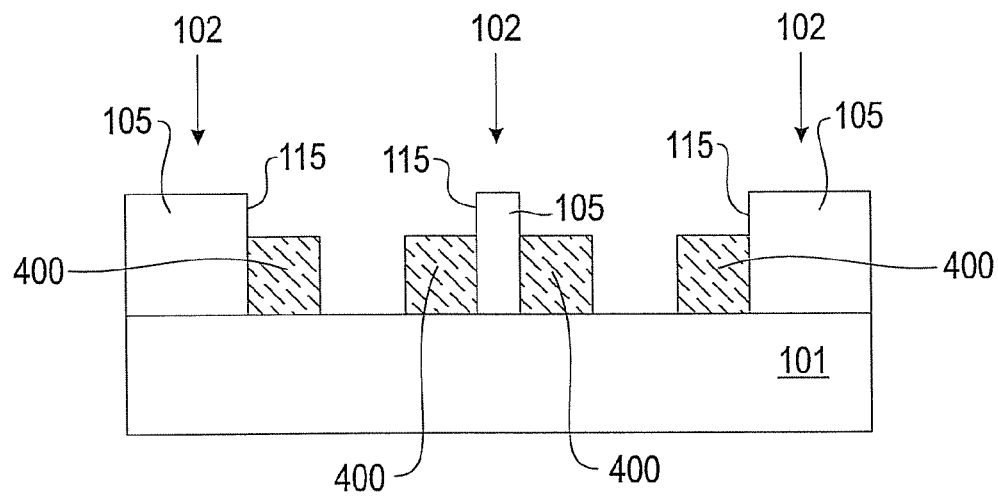
FIG. 1D is an illustration of FIG. 1C after removing selectively one or more immiscible polymers, in accordance with embodiments of the present invention.

FIG. 1D is an illustration of FIG. 1C after removing selectively one or more immiscible polymers of the two or more immiscible polymers, wherein at least one immiscible polymer of the two or more immiscible polymers remains on the substrate 101 after the removing, resulting in forming structures on the substrate 101, where the structures comprise the substructure 105 and the at least one immiscible polymer remaining on the surface.

Removing selectively one or more immiscible polymers may comprise using a process such as developing (such as developing in aqueous base developer), dissolving in solvent, and plasma etching, where the selected process may selectively remove the targeted polymer or polymers and leave other polymers remaining. In the example of FIG. 1D, the second polymer 405 of FIG. 1C has been selectively removed, resulting in forming structures comprising the first polymer 400 and the substructure 105 on the substrate 101, and resulting in the first immiscible polymer remaining against the at least one sidewall 115 and reducing an effective dimension of the feature. A dimension of the feature may comprise the lateral width (such as a spacing between two or more sidewalls), diameter (such as in a case where the feature is a cylindrical hole), the depth of a hole, or a combination of these. Where polymer remains disposed against a sidewall 115, for example, the effective lateral width of the feature 102 has been reduced by the thickness of the polymer layer formed. Where the feature comprises a hole, the effective diameter of the hole may be reduced by polymer remaining disposed against the sidewall.

Figure 1E:
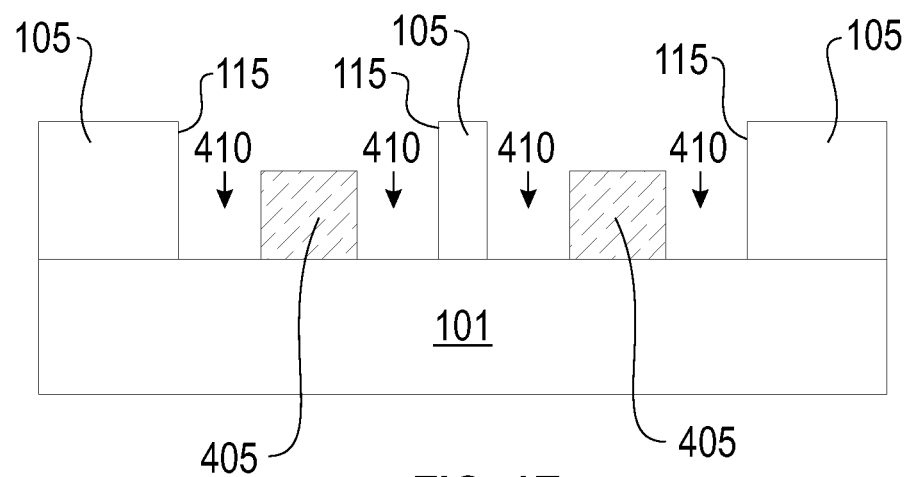
FIG. 1E is an illustration of FIG. 1C, where the first polymer has been removed, in accordance with embodiments of the present invention.

FIG. 1E is an illustration of FIG. 1C, where the first polymer 400 has been removed, resulting in formation of a spaces 410 between the at least one sidewall 115 and the second polymer 400 remaining on said substrate 101. Removal of the first polymer 400 results in forming structures comprising a pattern of spaces 410, and subfeatures, where the subfeatures comprise the substructure 105 and the second polymer 405.

Figure 1F:
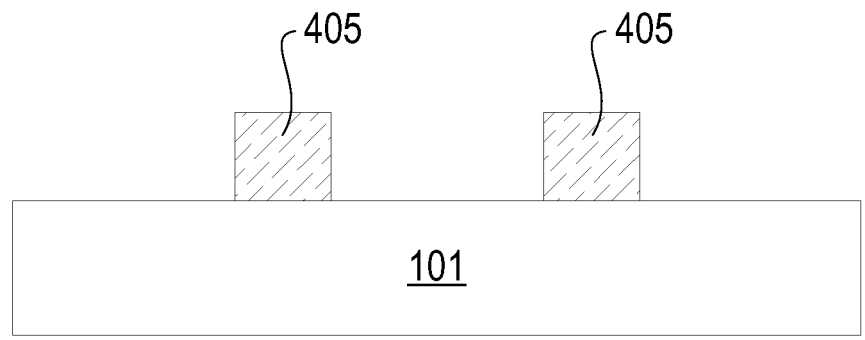
FIG. 1F is an illustration of FIG. 1C, where the first polymer and the substructures have been removed, in accordance with embodiments of the present invention.

FIG. 1F is an illustration of FIG. 1C, where the first polymer 400 and the substructures 105 have been removed, resulting in structures remaining on the substrate, where the structures comprise the second polymer 405.

Figure 1G:
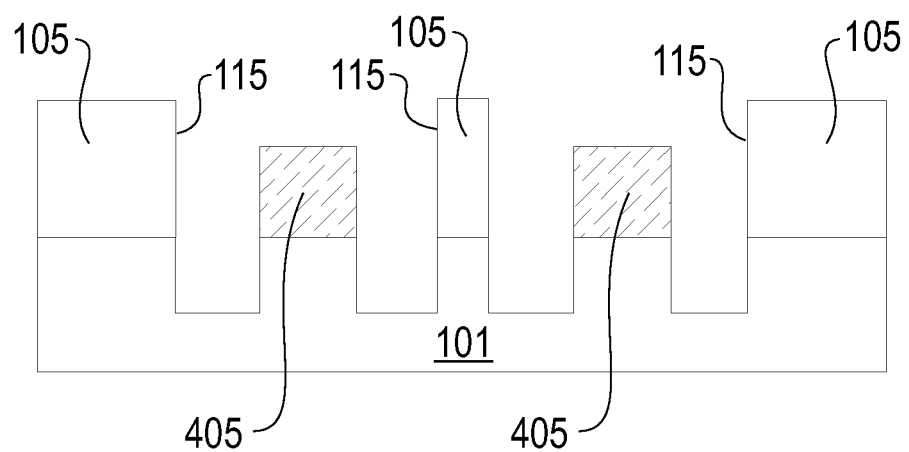
FIG. 1G is an illustration of FIG. 1E after transferring the pattern of structures to the substrate, in accordance with embodiments of the present invention.
Figure 1H:
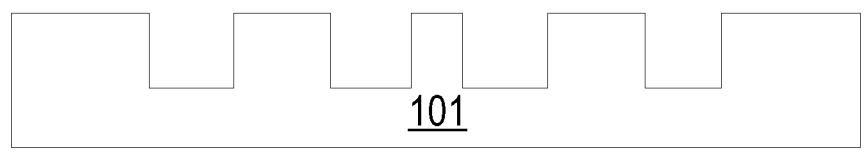
FIG. 1H is an illustration of FIG. 1G after removal of the substructure and the remaining at least one polymer, in accordance with embodiments of the present invention.

FIG. 1G is an illustration of FIG. 1E after transferring the pattern of structures to the substrate 101. FIG. 1H is an illustration of FIG. 1G after removal of the substructure 105 and the remaining at least one polymer to leave the patterned substrate 101 remaining.

Figure 2A:
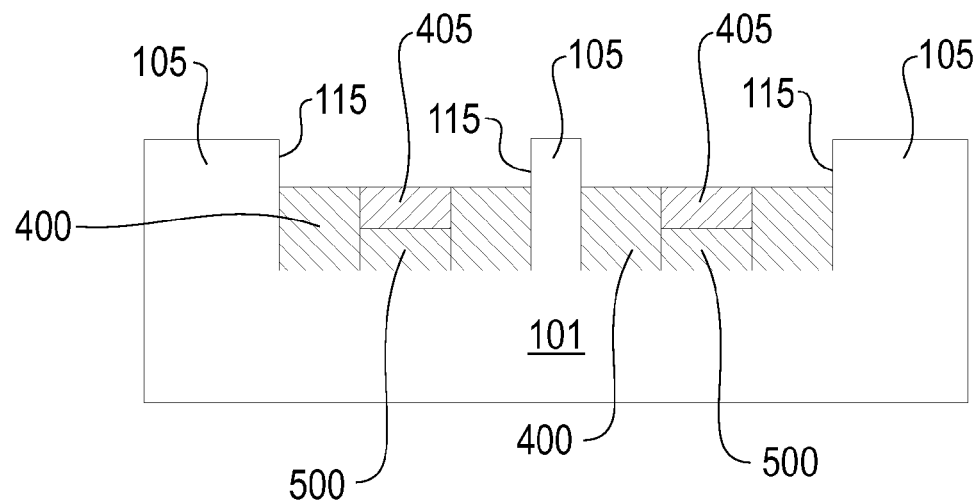
FIG. 2A is an illustration of the example of FIG. 1B after segregating the first polymer from the second polymer, in accordance with embodiments of the present invention.

FIG. 2A is an illustration of the example of FIG. 1B after segregating the first polymer 400 from the second polymer 405, where the first polymer 400 has a higher affinity for the material comprising the bottom 120 than does the second polymer 405, resulting in a first portion 500 of said first polymer 400 being disposed between the second polymer 405 and the bottom 120. In FIG. 2A, the bottom material may comprise the same material as the at least one sidewall or may comprise a material which is sufficiently chemically similar such that the first polymer has a higher affinity for the bottom than does the second polymer. For example, the at least one sidewall and the bottom may each comprise hydrophobic materials, where the first polymer comprises a hydrophobic polymer and the second polymer comprises a hydrophilic polymer.

Figure 2B:
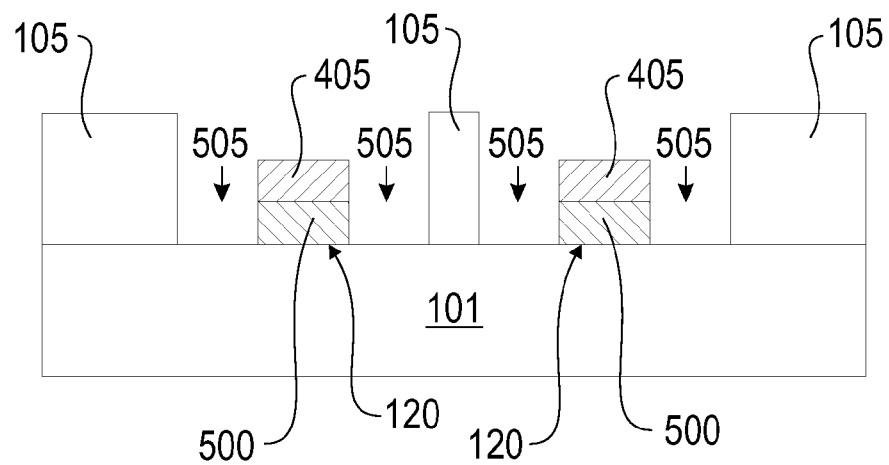
FIG. 2B is an illustration of example of FIG. 2A after removing a second portion of said first polymer, in accordance with embodiments of the present invention.

FIG. 2B is an illustration of example of FIG. 2A after removing a second portion of said first polymer 400, resulting in a structure remaining on the surface of the substrate, where the structure comprises the substructure 105, the second polymer 405, and the first portion 500 of the first polymer 400 disposed between the second polymer 405 and the bottom 120. Removing selectively the first polymer 400 results in formation of spaces 505 between the at least one sidewall 115 and the second polymer 405 remaining.

Figure 3:
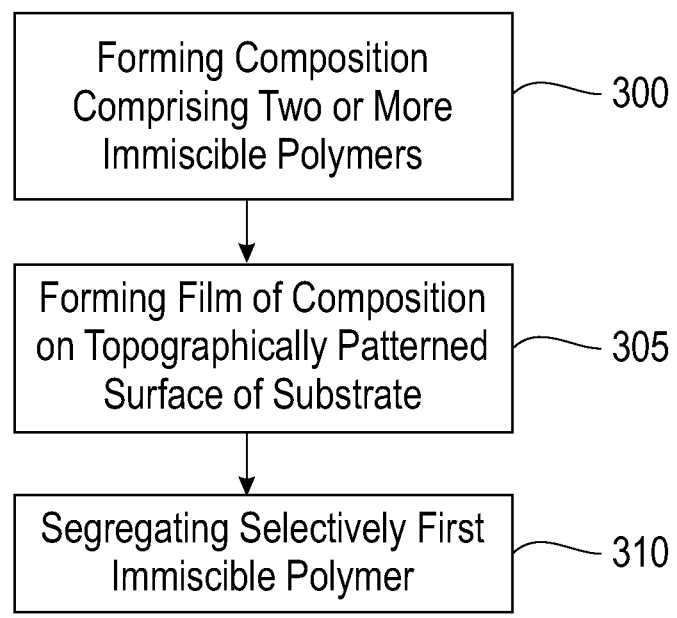
FIG. 3 is a flow chart illustrating a material alignment method, in accordance with embodiments of the present invention.

FIG. 3 is a flow chart illustrating a method. Step 300 comprises forming a composition comprising two or more immiscible polymers. The two or more immiscible polymers may comprise a first immiscible polymer and a second immiscible polymer, such as those described above. The composition may comprise a third material blended with the two or more immiscible polymers. The third material may be miscible with the first polymer, the second polymer, both the first polymer and the second polymer, or neither the first polymer nor the second polymer. The third material may comprise a polymer having a structure where a first portion of the structure is miscible with the first polymer and a second portion of the structure is miscible with the second polymer. For example, the third material may comprise a block copolymer having polymer blocks miscible with the first polymer, polymer blocks miscible with the second polymer, or a combination of these.

Step 305 comprises forming a film of the composition on a topographically patterned surface of a substrate, where the surface may have a plurality of features disposed thereon, such as the substrates described above having substructures disposed thereon. Each feature of the plurality of features may have at least one sidewall essentially perpendicular to the surface, such as a trench having at least two sidewalls, or a hole having one sidewall, for example. Each feature may be separated from adjacent features by a distance across the substrate surface. Examples of features include holes, posts, islands, lines, and trenches, etc., any of which may be isolated or nested. The at least one sidewall may comprise a first material, where said first immiscible polymer has a selective chemical affinity for the first material which is greater than the selective chemical affinity of the second immiscible polymer for the first material, such as described above.

Step 310 comprises segregating selectively the first immiscible polymer to the at least one sidewall. The segregating of step 310 may occur either during or after the film forming of step 305. The segregating of the first polymer at the at least one sidewall may result in excluding the second polymer from the at least one sidewall by the first polymer due to the high affinity of the first polymer for the material of the sidewall. As the first polymer forms a layer next to the at least one sidewall, the second polymer may be displaced away from the at least one sidewall by the first polymer. Thus resulting in the first immiscible polymer forming a first layer conforming to the at least one sidewall, and the second immiscible polymer forming a second layer conforming to the first layer. The first layer may be disposed between the at least one sidewall and the second layer, resulting in the first layer, the second layer and the third material aligning essentially parallel to the at least one sidewall. As the first layer conforms to the at least one side wall, the layer aligns with the at least one sidewall, following the direction of the sidewall. For example, where the sidewall is a sidewall of a hole, the first layer conforms to the sidewall and aligns with and follows the circumference of the sidewall. Likewise, the second layer aligns with and conforms to the direction of the first layer.

A third material dissolved in the first layer or the second layer, may be automatically aligned with the layer in which it is dissolved as the layer is formed and aligned. For a third material which a first portion of the structure is miscible with the first polymer and a second portion of the structure is miscible with the second polymer, the third material may be disposed along the interface between the first layer and the second layer, where each portion of the third material's structure is dissolved in the corresponding layer with which it is miscible. The third material may be used to adjust the interfacial energy between first and second polymers and thus optimize segregation of the first and second polymer in the topography. The third material may be disposed at the bottom surface if it has a higher chemical affinity for the bottom surface than both of the immiscible polymers. If the third material has a lower surface energy than the two immiscible polymers, it may be disposed at the air interface of the resulting film. After forming the film, one or more of the two or more immiscible polymers or the third material may be removed from the film, as described for the polymers above.

The method of FIG. 3 may further comprise annealing the film either after forming the film in step 300 or during forming the film in step 300. Annealing may comprise methods such as thermal annealing, solvent vapor annealing, zone annealing, and combinations thereof. Annealing may accelerate or otherwise induce the segregation of the two or more polymers.

These embodiments described herein have a number of advantages over conventional processes. For cases where it is desired to shrink the CD of patterned spaces, conventional processes such as thermal reflow, RELACS®, or SAFIER® have detrimental dependencies on pattern geometry (density and pitch), process conditions (baking time and temperature) and/or resist chemistry which limits that the process window of these approaches. The embodiments disclosed herein provide a way to reduce feature dimensions which is less sensitive to the resist chemistry and process conditions. The lateral dimension of the segregated polymer domains may be determined by the ratio of the different polymers used in the composition. Since this ratio is predetermined, the resulting dimensions of the segregated polymer domains have little to no dependence on bake temperature and bake time variations or specific resist chemistry.

Processes employing double patterning and sidewall image transfer techniques, when used to create patterns with dimensions and/or pitches smaller than that of an initial pattern produced by optical lithography, are very costly and process intensive. Often, they require multiple patterning, deposition, or etch steps. The polymer blend approach disclosed herein involves primarily spin-casting and baking steps which can be performed by a single track tool. This track-only process would advantageously lower process costs and increase throughput.

The immiscible polymers used in the segregating composition may be selected appropriately for the respective process (i.e. shrink or frequency multiplication). For example, for the process shown in FIG. 1D, the first polymer may have higher affinity for the sidewall than the second polymer. In addition, it is advantageous if the second polymer has a higher etch rate or dissolution rate in developer than the first polymer so that the second polymer can be selectively removed. This may be accomplished, for example, by selecting a second polymer with a high etch rate or dissolution rate in developer or by selecting a first polymer with a lower etch rate or lower dissolution rate in developer. The relative properties of either the first or second polymers may be tuned by incorporating a third material that will co-assemble with one of the polymers. For example, a organosilicate material can be added which would co-assemble with a polymer such as poly(ethylene oxide) and dramatically increase its oxygen plasma etch resistance.

For the method illustrated in FIG. 1E, it is advantageous where the properties of the first and second polymers are such that the first polymer can be easily removed by etching or dissolution in a developer. For the method illustrated in FIG. 1F, it is advantageous where, for example, the second polymer has a much higher etch resistance than either the first polymer or the material that comprises the substructure 105 (resist, transfer layer, hardmask, etc.). In one example where the substructure is a patterned organic photoresist, it is advantageous for the second polymer to contain elements such as silicon and germanium that provide high oxygen etch resistance or if a third material (such as an organosilicate) is co-assembled with the second polymer to provide such high etch resistance.

Many equivalent techniques to engineer the desired properties into the respective segregated polymer domains are known to those skilled in the art and are included in the scope of this invention.

Example 1

A solution containing polystyrene (PS, 22 kilograms/more (kg/mole), from polymer source) and polymethylmethacrylate (PMMA, 21 kg/mole from polymer source) and polystyrene-block-polymethylmethacrylate (PS-b-PMMA, 38 kg/mole-36 kg/mole, from polymer source) with a PS:PMMA:PS-b-PMMA weight ratio of 6:3:1 was cast onto a silicon wafer substrate coated with an anti-reflective coating (ARC) with thermally hardened line/space positive photoresist features having a pitch of 240 nm and then baked at 200° C. for 1 minute. PMMA segregated to form lines next to the resist sidewall and PS segregated to the middle of the resist space. PS-b-PMMA resided in the interface between PS and PMMA lines and was used to tune the interfacial energy between PS and PMMA. The sample was etched in an oxygen plasma for 10 seconds to remove the PMMA and showed remaining PS and resist lines with pitch of 120 nm.

Example 2

A polymer blend solution containing polystyrene (PS, 22 kg/mole, from polymer source) and polymethylmethacrylate (PMMA, 21 kg/mole from polymer source) and polystyrene-block-polymethylmethacrylate (PS-b-PMMA, 38 kg/mole-36 kg/mole, from polymer source) with a PS:PMMA:PS-b-PMMA weight ratio of 6:3:1 was cast on a substrate with negative e-beam resist (XR1541, hydrogen silsesquioxane from Dow Corning, hydrophilic resist) line/space features with a pitch of 110 nm and resist space from 50 nm to 80 nm. The sample was baked at 200° C. for 1 minute and etched under oxygen plasma for 10 sec. The remaining PS and resist lines demonstrated successful self-segregation in the narrower resist spaces.

Example 3

A polymer blend solution of poly($\alpha$-methyl-(4-hydroxyl benzyl) silsesquioxane-ran-($\alpha$-methyl-benzyl silsesquioxane)) (poly(HMBS$_{50}$-r-MBS$_{50}$) and poly(1,1,1-trifluoro-2-(trifluoromethyl)-2-hydroxy-pent-4-yl methacrylate) (poly(iPrHFAMA) with weight ratio 1:1 was cast on a substrate with line/space and hole/post features of a standard 193 nm positive resist (AR 1682). The sample was baked at 200° C. for 1 minute, developed in 0.26 N tetramethylammonium hydroxide solution (CD26 developer) for one minute, then rinsed and dried. The poly(iPrHFAMA) was removed by CD26 developer, and poly(HMBS$_{50}$-r-MBS$_{50}$) was left forming lines in between the resist lines and forming dots in between resist dots.

The foregoing description of the embodiments of this invention has been presented for purposes of illustration and description. It is not intended to be exhaustive or to limit the invention to the precise form disclosed, and obviously, many modifications and variations are possible. For example, the miscible material may be selected to be preferentially miscible with the second block of the block copolymer. Such modifications and variations that may be apparent to a person skilled in the art are intended to be included within the scope of this invention as defined by the accompanying claims.

What is claimed:

1. A method, comprising:
    applying a solution comprising two or more immiscible polymers to a substructure disposed on an exterior surface of a substrate, said exterior surface of the substrate having surface properties, said substructure comprising at least one feature having at least one sidewall and an adjoining bottom surface, said two or more immiscible polymers comprising a first polymer and a second polymer, said at least one sidewall comprising a first material, a selective chemical affinity of said first polymer for said first material being greater than a selective chemical affinity of said second polymer for said first material;
    segregating said first polymer from said second polymer, said first polymer selectively segregating to said at least one sidewall of said at least one feature, resulting in said first polymer being disposed between said sidewall and said second polymer to form a polymer segregation pattern in which said first polymer and said second polymer are distributed in a direction that is perpendicular to each sidewall of said at least one sidewall, wherein said first polymer and said second polymer have a same chemical affinity for the exterior surface of the substrate; and
    after said segregating, removing selectively one or more immiscible polymers of said two or more immiscible polymers, at least one immiscible polymer of said two or more immiscible polymers remaining on said substrate after said removing, resulting in forming structures on said substrate, said structures comprising said substructure and said at least one immiscible polymer remaining.

2. The method of claim 1, wherein the method further comprises forming said substructure on said substrate by a process selected from the group consisting of patterning a photoresist, patterning a polymer, patterning an inorganic material, etching, chemical vapor deposition, sputtering, atomic layer deposition, coating, and chemical attachment.

3. The method of claim 1, wherein said two or more immiscible polymers further comprises a third polymer selected from the group consisting of homopolymers, block copolymers, grafted copolymers, and random copolymers.

4. The method of claim 1, wherein said solution further comprises at least one component selected from the group consisting of photosensitive acid generators, surfactants, base quenchers, nanoparticles, metal compounds, inorganic compounds, and solvents.

5. The method of claim 1, wherein said one or more immiscible polymers of said two or more immiscible polymers comprises said second polymer, resulting in said first polymer remaining against said at least one sidewall and reducing a dimension of said feature.

6. The method of claim 1, wherein said one or more immiscible polymers of said two or more immiscible polymers comprises said first polymer, resulting in formation of a space between said at least one sidewall and said second polymer remaining.

7. The method of claim 1, wherein said removing is selected from the group consisting of developing, dissolving in solvent, and plasma etching, wherein said applying the solution comprises forming a film of the two or more immiscible polymers on the substrate, and wherein the method further comprises:
after said forming the film, annealing said film to induce said segregating.

8. The method of claim 1, wherein the first polymer, the second polymer, or both the first polymer and the second polymer is selected from the group consisting of cellulose, poly(acrylamide), polyethyleneimine, poly(acrylic acid), poly(2-ethyl-2-oxazoline), poly(ethyleneoxide), and poly(vinyl alcohol), novolac resins, cresol resins, poly(hydroxystyrene), poly(acrylic acid), poly(styrene sulfonic acid), poly(vinyl phosphoric acid), poly(vinyl sulfonic acid), poly(2-sulfoethyl methacrylate), poly(2-sulfopropyldimethyl-3-methacrylamide), poly(1,1,1-trifluoro-2-(trifluoromethyl)-2-hydroxy-pentan-4-ylmethacrylate), fluoroalcohol-based polymers, poly(2-ethyl-trifluoromethanesulfonamide methacrylate), acidic sulfonamide polymers, poly(hydroxyadamantyl methacrylate), poly(isobornyl methacrylate), poly(phenyl methacrylate), poly(vinyl naphthalene), polysiloxanes, polymethylsilsesquioxanes, polycarbosilanes, poly(vinyl ferrocene), poly(acylonitrile), poly(caprolactone), poly(lactide), poly(2-hydroxyethyl methacrylate), poly(gamma-butyrolactone methacrylate), poly(tetrahydrofuranyl methacrylate), poly(tetrahydropyranyl methacrylate), poly(allyl amine), poly(4-aminostyrene), poly(2-dimethylaminoethyl methacrylate), polyethyleneneimine, poly(N-methylvinylamine), poly(vinyl pyridine), poly(isoprene), poly(butadiene), poly(nobornene), poly(ethylene), poly(propylene), poly(1,1,1-trifluoro-2-(trifluoromethyl)-2-hydroxy-pentan-4-yl methacrylate), fluoroalcohol-based polymers, poly(2-ethyl-trifluoromethanesulfonamide methacrylate), acidic fluorosulfonamide polymers, poly(2,2,2-trifluoroethyl methacrylate), poly(hexafluoroisopropyl methacrylate), poly(2,3,4,5,6-pentafluorostyrene), and substituted derivatives thereof.

9. The method of claim 1, wherein the solution comprises a polymer blend consisting essentially of the two or more immiscible polymers.

10. The method of claim 1, wherein the solution comprises a polymer blend consisting of the two or more immiscible polymers.

11. A material alignment method, comprising:
forming a composition comprising a first immiscible polymer and a second immiscible polymer, wherein a totality of immiscible polymers in the composition consists of the first immiscible polymer and the second immiscible polymer;
forming a film of said composition on a topographically patterned surface of a substrate, said surface having a plurality of features disposed thereon, each feature of said plurality of features having at least one sidewall essentially perpendicular to said surface, said at least one sidewall comprising a first material, said first immiscible polymer having a selective chemical affinity for said first material greater than a selective chemical affinity of said second immiscible polymer for said first material; and
segregating selectively said first immiscible polymer to said at least one sidewall, said segregating resulting in excluding by said first immiscible polymer said second immiscible polymer from said at least one sidewall, resulting in said first immiscible polymer forming a first layer conforming to said at least one sidewall, said second immiscible polymer forming a second layer conforming to said first layer, said first layer disposed between said at least one sidewall and said second layer, resulting in formation of a polymer segregation pattern in which said first layer formed of said first immiscible polymer and said second layer formed of said second immiscible polymer are distributed in a direction that is perpendicular to each sidewall of said at least one sidewall.

12. The method of claim 11, said method further comprising annealing said film, wherein said annealing is selected from the group consisting of thermal annealing, solvent vapor annealing, zone annealing, and combinations thereof.

13. The method of claim 11, wherein said composition comprises a third material, wherein said third material is miscible with both said first immiscible polymer and said second immiscible polymer, said third material selected from the group consisting of block copolymers, grafted copolymers, and random copolymers.

14. The method of claim 11, wherein said first and second immiscible polymers are each selected from the group consisting of cellulose, poly(acrylamide), polyethyleneimine, poly(acrylic acid), poly(2-ethyl-2-oxazoline), poly(ethyleneoxide), and poly(vinyl alcohol), novolac resins, cresol resins, poly(hydroxystyrene), poly(acrylic acid), poly(styrene sulfonic acid), poly(vinyl phosphoric acid), poly(vinyl sulfonic acid), poly(2-sulfoethyl methacrylate), poly(2-sulfopropyldimethyl-3-methacrylamide), poly(1,1,1-trifluoro-2-(trifluoromethyl)-2-hydroxy-pentan-4-ylmethacrylate), fluoroalcohol-based polymers, poly(2-ethyl-trifluoromethanesulfonamide methacrylate), acidic sulfonamide polymers, poly(styrene), poly(hydroxyadamantyl methacrylate), poly(isobornyl methacrylate), poly(phenyl methacrylate), poly(vinyl naphthalene), polysiloxanes, polymethylsilsesquioxanes, polycarbosilanes, poly(vinyl ferrocene), poly(acylonitrile), poly(caprolactone), poly(lactide), poly(methyl methacrylate), poly(2-hydroxyethyl methacrylate), poly(gamma-butyrolactone methacrylate), poly(tetrahydrofuranyl methacrylate), poly(tetrahydropyranyl methacrylate), poly(allyl amine), poly(4-aminostyrene), poly(2-dimethylaminoethyl methacrylate), polyethyleneneimine, poly(N-methylvinylamine), poly(vinyl pyridine), poly(isoprene), poly(butadiene), poly(nobornene), poly(ethylene), poly(propylene), poly(1,1,1-trifluoro-2-(trifluoromethyl)-2-hydroxy-pentan-4-ylmethacrylate), fluoroalcohol-based polymers, poly(2-ethyl-trifluoromethanesulfonamide methacrylate), acidic fluorosulfonamide polymers, poly(2,2,2-trifluoroethyl methacrylate), poly(hexafluoroisopropyl methacrylate), poly(2,3,4,5,6-pentafluorostyrene), and substituted derivatives thereof.

15. The method of claim 11, wherein the first immiscible polymer, the second immiscible polymer, or both the first immiscible polymer and the second immiscible polymer is selected from the group consisting of cellulose, poly(acrylamide), polyethyleneimine, poly(acrylic acid), poly(-ethyl-2-oxazoline), poly(ethyleneoxide), and poly(vinyl alcohol), novolac resins, cresol resins, poly(hydroxystyrene), poly(acrylic acid), poly(styrene sulfonic acid), poly(vinyl phosphoric acid), poly(vinyl sulfonic acid), poly(-sulfoethyl methacrylate), poly(2-sulfopropyldimethyl-3-methacrylamide), poly(1,1,1-trifluoro-2-(trifluoromethyl)-2-hydroxy-pentan-4-ylmethacrylate), fluoroalcohol-based polymers, poly(-ethyl-trifluoromethanesulfonamide methacrylate), acidic sulfonamide polymers, poly(hydroxyadamantyl methacrylate), poly(isobornyl methacrylate), poly(phenyl methacrylate), poly(vinyl naphthalene), polysiloxanes, polymethylsilsesquioxanes, polycarbosilanes, poly(vinyl ferrocene), poly(acylonitrile), poly(caprolactone), poly(lactide), poly(-hydroxyethyl methacrylate), poly(gamma-butyrolactone methacrylate), poly(tetrahydrofuranyl methacrylate), poly(tetrahydropyranyl methacrylate), poly(allyl amine), poly(-aminostyrene), poly(2-dimethylaminoethyl methacrylate), polyethyleneimine, poly(N-methylvinylamine), poly(vinyl pyridine), poly(isoprene), poly(butadiene), poly(nobornene), poly(ethylene), poly(propylene), poly(1,1,1-trifluoro-2-(trifluoromethyl)-2-hydroxy-pentan-4-ylmethacrylate), fluoroalcohol-based polymers, poly(2-ethyl-trifluoromethanesulfonamide methacrylate), acidic fluorosulfonamide polymers, poly(2,2,2-trifluoroethyl methacrylate), poly(hexafluoroisopropyl methacrylate), poly(2,3,4,5,6-pentafluorostyrene), and substituted derivatives thereof.

16. A method of forming controlled polymer patterns, comprising:
   forming a material layer of a polymer blend on a surface of a topographically patterned substrate comprising prepatterned features separated by a bottom surface, said polymer blend comprising two immiscible polymers identified as polymer A and polymer B, sidewalls of said features having a composition different from a composition of said bottom surface, wherein a totality of immiscible polymers in the polymer blend consists of polymer A and polymer B;
   forming a segregating film on said topographically patterned substrate, wherein components in said material layer laterally segregate in accordance with the patterned substrate, and wherein polymer A preferentially segregates next to said sidewalls and polymer B preferentially segregates to a center region between said features, said formed segregation film comprising a polymer segregation pattern in which polymer A and polymer B are distributed in a direction that is perpendicular to said sidewalls; and
   selectively removing polymer A or polymer B from said segregated film.

17. The method of claim 16, wherein polymer B is selectively removed with or without removing said features and without removing polymer A.

18. The method of claim 16, wherein polymer A is selectively removed without removing said features and without removing polymer B.

19. The method of claim 16, wherein polymer A, polymer B, or both polymer A and polymer B is selected from the group consisting of cellulose, poly(acrylamide), polyethyleneimine, poly(acrylic acid), poly(2-ethyl-2-oxazoline), poly(ethyleneoxide), and poly(vinyl alcohol), novolac resins, cresol resins, poly(hydroxystyrene), poly(acrylic acid), poly(styrene sulfonic acid), poly(vinyl phosphoric acid), poly(vinyl sulfonic acid), poly(2-sulfoethyl methacrylate), poly(2-sulfopropyldimethyl-3-methacrylamide), poly(1,1,1-trifluoro-2-(trifluoromethyl)-2-hydroxy-pentan-4-ylmethacrylate), fluoroalcohol-based polymers, poly(2-ethyl-trifluoromethanesulfonamide methacrylate), acidic sulfonamide polymers, poly(hydroxyadamantyl methacrylate), poly(isobornyl methacrylate), poly(phenyl methacrylate), poly(vinyl naphthalene), polysiloxanes, polymethylsilsesquioxanes, polycarbosilanes, poly(vinyl ferrocene), poly(acylonitrile), poly(caprolactone), poly(lactide), poly(2-hydroxyethyl methacrylate), poly(gamma-butyrolactone methacrylate), poly(tetrahydrofuranyl methacrylate), poly(tetrahydropyranyl methacrylate), poly(allyl amine), poly(4-aminostyrene), poly(2-dimethylaminoethyl methacrylate), polyethyleneimine, poly(N-methylvinylamine), poly(vinyl pyridine), poly(isoprene), poly(butadiene), poly(nobornene), poly(ethylene), poly(propylene), poly(1,1,1-trifluoro-2-(trifluoromethyl)-2-hydroxy-pentan-4-ylmethacrylate), fluoroalcohol-based polymers, poly(2-ethyl-trifluoromethanesulfonamide methacrylate), acidic fluorosulfonamide polymers, poly(2,2,2-trifluoroethyl methacrylate), poly(hexafluoroisopropyl methacrylate), poly(2,3,4,5,6-pentafluorostyrene), and substituted derivatives thereof.

* * * * *